United States Patent [19]

Dautartas

[11] Patent Number: 5,396,702
[45] Date of Patent: Mar. 14, 1995

[54] METHOD FOR FORMING SOLDER BUMPS ON A SUBSTRATE USING AN ELECTRODEPOSITION TECHNIQUE

[75] Inventor: Mindaugas F. Dautartas, Alburtis

[73] Assignee: AT&T Corp., Murray Hill, N.J.

[21] Appl. No.: 167,687

[22] Filed: Dec. 15, 1993

[51] Int. Cl.⁶ .............................................. H05K 3/34
[52] U.S. Cl. ....................................... 29/840; 29/846; 29/884; 29/885; 228/180.22
[58] Field of Search ............... 29/830, 840, 846, 884, 29/885; 427/96; 228/180.22

[56] References Cited

U.S. PATENT DOCUMENTS

| | | | |
|---|---|---|---|
| 3,458,925 | 8/1969 | Napier et al. | 228/180.22 |
| 3,716,907 | 2/1973 | Anderson | 228/180.22 |
| 4,950,623 | 8/1990 | Dishan | 29/877 |
| 5,130,275 | 7/1992 | Dion | 228/180.22 |
| 5,162,257 | 11/1992 | Yung | 29/825 |

FOREIGN PATENT DOCUMENTS 932877  8/1973  Canada .................................. 29/840

Primary Examiner—Mark Rosenbaum
Assistant Examiner—Dave Bryant
Attorney, Agent, or Firm—Richard D. Laumann

[57] ABSTRACT

Solder bumps are electrodeposited onto a substrate with carefully controlled heights by forming patterned conductors on an substrate, depositing and patterning a layer of material, such as titanium that is easily oxidized, and electrodepositing the solder bumps. The solder does not deposit on the titanium. Solder bumps of uniform height are obtained because the titanium layer acts as part of the electrical circuit during electrodeposition.

9 Claims, 2 Drawing Sheets

METHOD FOR FORMING SOLDER BUMPS ON A SUBSTRATE USING AN ELECTRODEPOSITION TECHNIQUE

TECHNICAL FIELD

This invention relates generally to the formation of bond pads on substrates and particularly to the formation of bond pads on selected portions of substrates by electrodeposition.

BACKGROUND OF THE INVENTION

During manufacture of an electrical or opto-electronic package, electrical or optical devices or integrated circuits are frequently attached to a substrate. This is often accomplished by forming bond pads on the electrical or optical device or integrated circuit. The bond pads are placed in contact with corresponding portions of the substrate that have solder bumps or solder balls. A heating step then causes the solder to reflow and attach the device to the substrate.

The formation of the solder bumps is a critical step in the manufacturing processes used in fabricating the packages; manufacturing processes frequently require both accurate dimensions and placement of the solder bumps, and several techniques have been developed for the formation of the solder humps. An exemplary technique is a lift-off process. In this technique, a resist layer is formed on the substrate and patterned to form windows which expose selected portions of the substrate. The solder hump material is deposited on the substrate by, for example, sputtering. The resist is then lifted off by immersion of the substrate and resist in a solvent which attacks the exposed portions of the resist in the sides of the windows and ultimately removes all of the resist, as well as the metal on the resist, from the substrate. The lift-off is facilitated with windows having a negative taper; that is, the windows are bigger at the bottoms than they are at the tops. The negative taper exposes more resist to the solvent than does a window with no taper. The lift-off technique suffers from the drawbacks of poor resist adhesion to the substrate and limited solder bump height due to small resist thickness; the solder bump height can not exceed the resist thickness.

Electrodeposition is another technique that has also been used to form solder bumps. Electrodeposition may be done with patterned resists or other patterned insulating surfaces that expose a conducting surface; electrodeposition does not occur on insulating surfaces, but only on conducting surfaces. The areas where solder bumps are to be formed are connected to a current source by patterned conductors on the substrate surface. However, the patterned conductors have a finite resistance which, of course, becomes larger as the dimensions of the conductors shrink. The conductors become smaller as device dimensions decrease and more contacts are made to the devices and integrated circuits. The plating rate, and ultimately the amount of solder plated, at any point is proportional to the electric field at that point. Due to the voltage drop caused by the finite resistance, the electric field is not necessarily the same at all the areas being plated and the solder bumps may have varying heights.

Varying solder bump heights are undesirable liar several reason. For example, self-alignment of devices with respect to the substrate is difficult with bumps having different size; that is, the solder bumps should all have the same amount of solder to permit accurate self-alignment. Additionally, many devices and integrated circuits require alignment only with respect to the plane of the substrate; that is, only with respect to the patterned conductors on the substrate. There are, however, devices, such as lasers, that must be attached to a substrate with accurate alignment in the direction perpendicular to the plane of the substrate; that is, in the z direction. Accurate alignment in the z direction is difficult to obtain if the solder bumps have varying heights.

SUMMARY OF THE INVENTION

According to an exemplary embodiment of this invention, solder bumps are formed on a substrate by forming patterned conductors on an insulating substrate; blanket depositing a layer of a conducting material on the patterned conductors; and removing selected portions of the conducting material to expose selected portions of the patterned conductors. Solder bumps are now formed by electrodepositing material to form the solder bumps. There is an electrical contact to the conducting material so that the electrical circuit goes through this material. The conducting material has a surface on which electrodeposition does not occur. The integrated circuit chip is then attached to the solder bumps. In a preferred embodiment, the conducting material is removed before the integrated circuit chip is attached. In yet other preferred embodiments, the conducting material comprises Ti, and the solder bumps comprises layers of gold and tin.

In a further preferred embodiment, a dielectric layer is formed prior to the deposition of the conducting material, and the removing step removes the portions of the dielectric layer underneath the conducting layer. A layer of conducting material is deposited after the removing step, and then patterned to cover both the exposed portions and adjacent portions of said conducting layer.

For reasons of clarity, the elements depicted are not drawn to scale.

DETAILED DESCRIPTION

Figure 1:
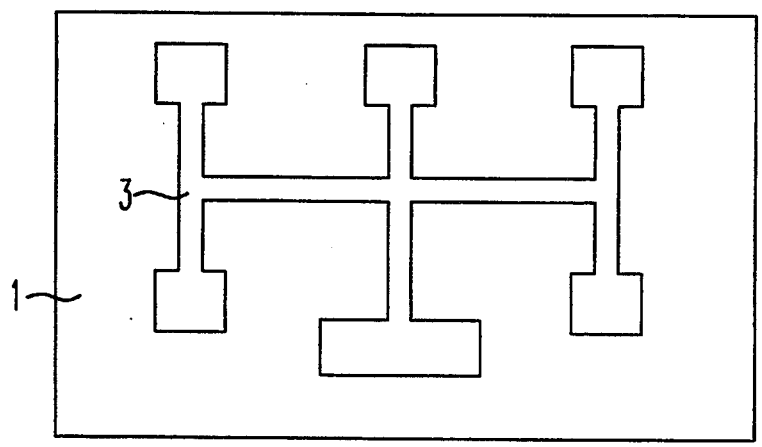
FIGS. 1-2 are top views of a substrate on which solder bumps are formed.
Figure 2:
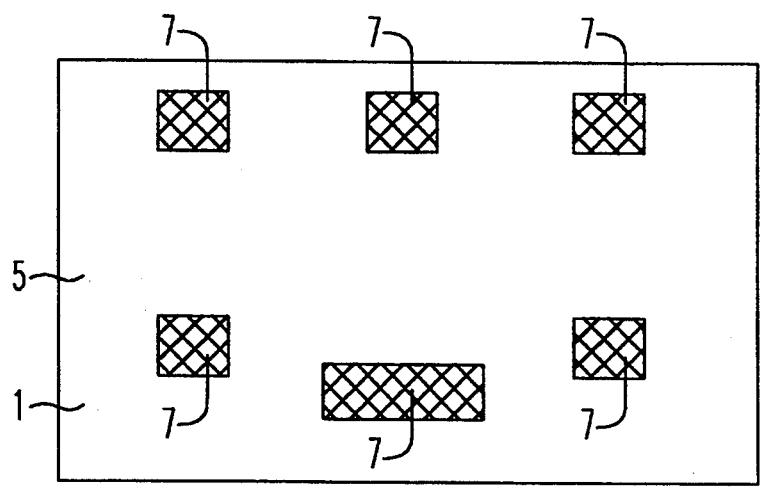

The invention will be described by reference to an exemplary embodiment after which several variations will be discussed. Still other variations will be apparent to those skilled in the art. Depicted in FIG. 1 are substrate 1 and electrically conducting pattern 3. The substrate is a dielectric such as silicon oxide. There may be a semiconductor material, such as a silicon wafer, under the dielectric. The term "substrate" is used to mean a material that lies underneath and supports another material. Numerous materials can be used to form the electrically conducting pattern; precise choice will depend upon the contemplated application. A widely useful choice is formed by layers of Ti, TiN, and Pt which are sequentially deposited and then patterned, using conventional lithographic techniques, to form the desired pattern. Conventional deposition techniques, such as vacuum deposition, may be used. A layer 5 of conducting material, such as titanium, is now blanket deposited and patterned to expose those portions 7 of the conducting pattern 3 where solder bumps are desired. Portions 7 are chess hatched, and the patterned structure is depicted in FIG. 2. Electrodeposition should not occur on the conducting material; titanium is an exemplary choice for the conducting material because it forms an oxide upon exposure to the ambient atmosphere and deposition does not occur on the oxide.

Several comments about materials are appropriate. The conducting layers may be formed from metals or conducting compounds; titanium, titanium nitride, and platinum are exemplary choices. Of course, only a single material in a single layer need be present. The layer of conducting material is desirably formed from a material that oxidizes readily or otherwise forms a surface that is not conducive to electrodeposition as compared to the electrically conducting pattern. Titanium is an exemplary choice.

Formation of the solder bumps and the other steps necessary to attach a chip to the substrate 1 will now be understood. Portions 7 are exposed; that is, they are not covered with titanium. The areas not exposed are covered with titanium. Electrical contact can be made to this layer, and it will carry current but electrodeposition of Au/Sn will not occur. It is desirable that a relatively thick, 0.5 um to 1.0 um, layer of Au be plated first. Layers of Sn and Au may then be sequentially plated for a total thickness in the approximate range of 6 to 9 um. Simultaneous plating of Sn and Au may be difficult. Plating of alternate Au and Sn layers is therefore desirable. The total composition is slightly, 4 percent to 6 percent, Sn rich relative to the eutectic. Plating solutions and baths will be readily selected by those skilled in the art. After solder bump deposition has been completed, the titanium layer is removed with an etchant such as EDTA. Conventional techniques can now be used to attach the chip to the solder bumps and thus to the substrate.

It will be appreciated that the presence of the electrically conducting layers provides substantially identical electric fields at the places where the solder bumps are being formed. As previously explained, the identical electric fields provide identical deposition rates and substantially identical solder bumps. The identical heights of the solder bumps permit the integrated circuit; that is, chip, to be mounted on the substrate with accurate alignment in the direction perpendicular to the plane of the substrate as well as in the directions parallel to the plane of the substrate.

Figure 3:
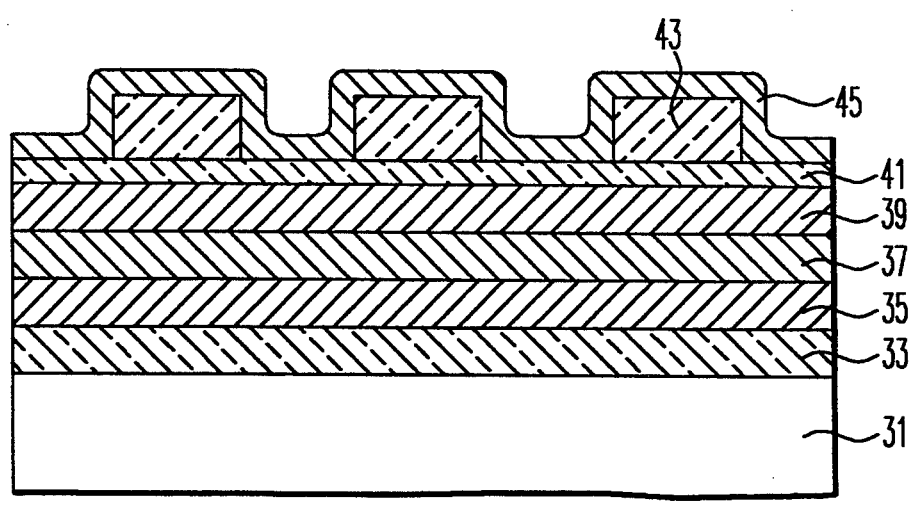
FIGS. 3-6 are sectional views of a portion of the substrate at an intermediate stage in the fabrication process.
Figure 4:
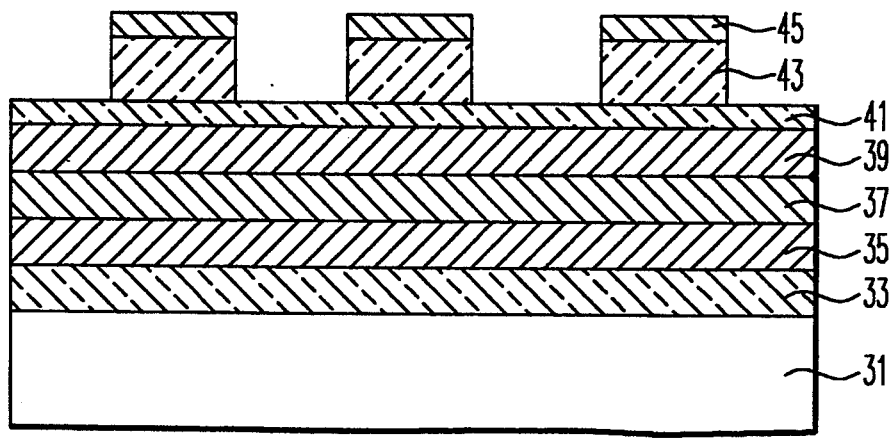

The platinum layer is the primary conduction path for the electrical circuit. An alternative structure that is more robust, although the processing is more complex, is shown in FIG. 3. Depicted are substrate 31, dielectric layer 33, metal layers 35 and 37, platinum layer 39, gold layer 41, patterned dielectric 43, and titanium layer 45. The dielectric layers are typically silicon oxides or nitrides. Layers 35 and 37 can be titanium and titanium nitride as they were for the embodiment described with respect to FIGS. 1 and 2. The titanium (layer 45) is removed from those areas where the solder bumps will be formed leading to the structure shown in FIG. 4. Layer 39 is the primary conduction layer. The titanium can be removed after solder bumps have been formed as previously described.

Figure 5:
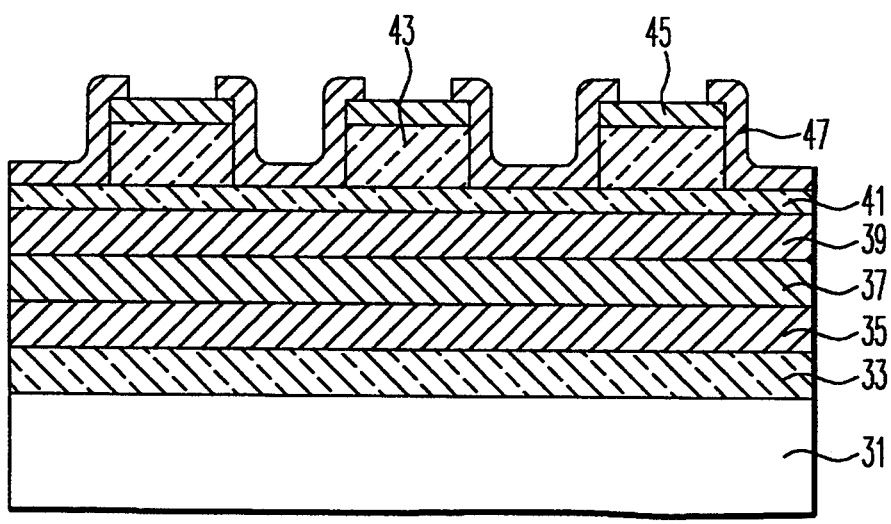
Figure 6:
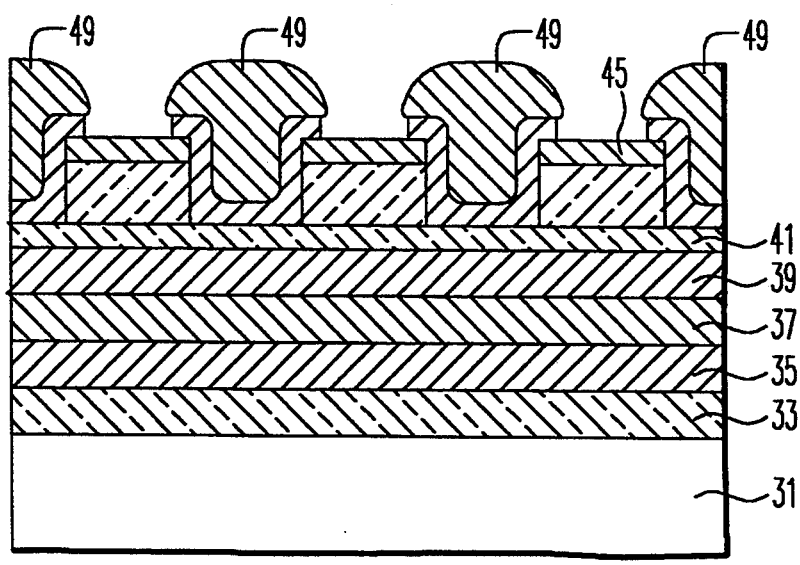

Solder bumps larger than the opening in the oxide/titanium layers can be formed by depositing and patterning a gold layer 47 after the oxide/titanium layers have been patterned. The gold 47 is patterned so that it is larger than are the openings in the oxide/titanium layers. The resulting structure is depicted in FIG. 5 The gold layer 47 can be relatively thin; several hundred angstroms are typically sufficient. Solder bumps 49 can now be plated and the structure depicted in FIG. 6 is obtained.

This embodiment is advantageously used because it permits easy control of the solder bump height after reflow. The titanium layer, and its oxide (not shown) which is present after the titanium is exposed to the atmosphere, are important because the solder does not wet the titanium. As shown, the solder bump is confined to the relatively small patterned gold areas 47. Increasing the size of the patterned gold layer increases the height of the solder bump. Another advantage of this embodiment is the fact that the gold layer is the primary conductive layer. Higher electrical and thermal conductances result.

Variations of the embodiments described will be readily thought of by those skilled in the art. For example, the solder bumps may be formed from materials other than tin/gold.

I claim:

1. A method of forming solder bumps on a substrate comprising the steps of:
    forming patterned conductors on an insulating substrate;
    blanket depositing a layer of a conducting material on said patterned conductors, said material having a surface on which electrodeposition will not occur;
    removing selected portions of said conducting material to expose selected portions of said patterned conductors; and
    electrodepositing material on said selected portions to form solder bumps thereon, said electrodepositing step including electrical contact to said conducting material.

2. A method as recited in claim 1 comprising the further step of attaching an integrated circuit chip to said solder bumps.

3. A method as recited in claim 1 comprising the further step of removing all remaining portions of said conducting material after said electrodepositing step.

4. A method as recited in claim 1 in which said conducting material comprises Ti.

5. A method as recited in claim 1 in which said solder bumps comprise at least one member selected from the group consisting of Sn and Au.

6. A method as recited in claim 5 in which said solder bumps comprise both Sn and Au.

7. A method as recited in claim 6 in which said Sn and said Au are separately deposited.

8. A method as recited in claim 1 comprising the further step of:
    forming a dielectric layer on said patterned conductors prior to depositing said conducting material thereon,
    wherein said removing step also removes the portions of said dielectric layer underneath said conducting layer.

9. A method as recited in claim 8 comprising the further steps of:
    depositing a second layer of conducting material on said exposed portions of said patterned conductors after said removing step; and
    patterning said second layer to cover said exposed portions and adjacent portions of said conducting layer.

* * * * *